(12) United States Patent
Lee et al.

(10) Patent No.: US 10,276,833 B2
(45) Date of Patent: *Apr. 30, 2019

(54) ORGANIC LIGHT EMITTING DIODE DISPLAY AND MANUFACTURING METHOD THEREOF

(75) Inventors: Sung-Soo Lee, Yongin (KR); Ok-Keun Song, Yongin (KR); Chan-Young Park, Yongin (KR); Yong-Han Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 493 days.

This patent is subject to a terminal disclaimer.

(21) Appl. No.: 13/467,968

(22) Filed: May 9, 2012

(65) Prior Publication Data

US 2013/0048986 A1 Feb. 28, 2013

(30) Foreign Application Priority Data

Aug. 25, 2011 (KR) .......................... 10-2011-0085286

(51) Int. Cl.
*H01L 51/52* (2006.01)
*H01L 27/32* (2006.01)

(52) U.S. Cl.
CPC ...... *H01L 51/5265* (2013.01); *H01L 27/3211* (2013.01); *H01L 51/5281* (2013.01)

(58) Field of Classification Search
CPC ................................. H01L 33/42; H01L 33/44
(Continued)

(56) References Cited

U.S. PATENT DOCUMENTS 8,258,691 B2 * 9/2012 Lee ..................... H01L 27/3206
313/504
2005/0142976 A1 6/2005 Suzuki
(Continued)

FOREIGN PATENT DOCUMENTS

CN 1868240 A 11/2006
CN 1897252 A 1/2007
(Continued)

OTHER PUBLICATIONS

Patent Abstracts of Japan for Publication No. 2004-207126, dated Jul. 22, 2004 for Patent No. JP 4069745 B2, 1 page.
(Continued)

*Primary Examiner* — Jamie C Niesz
(74) *Attorney, Agent, or Firm* — Lewis Roca Rothgerber Christie LLP

(57) ABSTRACT

An OLED display includes: a first pixel including a first pixel electrode of a pixel electrode, a second pixel including a second pixel electrode of the pixel electrode, and a third pixel including a third pixel electrode of the pixel electrode; a resonance assistance layer on the first pixel electrode; an organic emission layer including a first organic emission layer on the resonance assistance layer and the second pixel electrode, a second organic emission layer on the first organic emission layer, and a third organic emission layer on the third pixel electrode; a common electrode on the organic emission layer; and a color mixture preventing layer on the common electrode and configured to absorb overlapped light in an overlapped wavelength region of a wavelength region of first light emitted by the first organic emission layer and a wavelength region of second light emitted by the second organic emission layer.

12 Claims, 16 Drawing Sheets

(58) Field of Classification Search
USPC .......................... 257/40, 52, 90; 438/29, 35
See application file for complete search history.

(56) References Cited

U.S. PATENT DOCUMENTS

| | | | |
|---|---|---|---|
| 2007/0015429 A1 | 1/2007 | Maeda et al. | |
| 2007/0102737 A1* | 5/2007 | Kashiwabara | H01L 27/3211 257/291 |
| 2007/0210703 A1* | 9/2007 | Izzanni | H01L 27/322 313/504 |
| 2009/0200544 A1* | 8/2009 | Lee | H01L 51/5215 257/40 |
| 2009/0230853 A1 | 9/2009 | Kanai | |
| 2010/0156279 A1* | 6/2010 | Tamura | H01L 27/3211 313/504 |
| 2011/0042697 A1* | 2/2011 | Lee | H01L 27/322 257/89 |
| 2011/0180825 A1* | 7/2011 | Lee | H01L 51/5048 257/89 |
| 2012/0001206 A1* | 1/2012 | Jeong | H01L 51/5215 257/89 |
| 2012/0168787 A1* | 7/2012 | Okumoto | H01L 27/3211 257/89 |

FOREIGN PATENT DOCUMENTS

| | | |
|---|---|---|
| CN | 102163615 A | 8/2011 |
| EP | 2 429 263 A1 | 3/2012 |
| JP | 2005-093399 | 4/2005 |
| JP | 2007-026852 | 2/2007 |
| JP | 2007-234599 | 9/2007 |
| JP | 4069745 B2 | 4/2008 |
| JP | 2010-517207 A | 5/2010 |
| JP | WO 2011/030374 * 3/2011 ............. H05B 33/12 |  |
| JP | 2011-155004 | 8/2011 |
| JP | 2012-199231 | 10/2012 |
| KR | 10-2006-0079194 A | 7/2006 |
| KR | 10-2008-0015507 | 2/2008 |
| KR | 10-0855659 | 9/2008 |
| KR | 10-2010-0071539 A | 6/2010 |
| KR | 10-2011-0087829 | 8/2011 |
| WO | WO 2010/116718 A1 | 10/2010 |
| WO | WO 2011/030374 A1 | 3/2011 |

OTHER PUBLICATIONS

Korean Patent Abstracts for Publication No. 10-2002-0096893 A, dated Dec. 31, 2002 for Patent No. KR 10-0855659, 2 pages.
Extended European Search Report dated May 26, 2014 for EP Application No. 12178551.3, 8 pages.
JPO Office action dated Feb. 1, 2016, for corresponding Japanese Patent application 2012-100790, (6 pages).
SIPO Office action dated Mar. 4, 2016, for corresponding Chinese Patent application 201210301113.6, (10 pages).

* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2011-0085286, filed in the Korean Intellectual Property Office on Aug. 25, 2011, the entire content of which is incorporated herein by reference.

BACKGROUND

1. Field

Aspects of embodiments of the present invention relate generally to an organic light emitting diode (OLED) display and a manufacturing method thereof.

2. Description of Related Art

An organic light emitting diode (OLED) display may include a plurality of light emitting diodes each having a hole injection electrode, an organic emission layer, and an electron injection electrode. The OLED display emits light by the energy that occurs when excitons that are generated by combinations of electrons and holes in the organic emission layer are switched to the ground state from the excited state. The OLED display displays images by using such light emission.

The OLED display has a self-luminance characteristic and does not need a separate light source. Accordingly, the thickness and weight thereof are decreased compared to those of a liquid crystal display. In addition, since the OLED display has high-grade characteristics such as low power consumption, high luminance, high reaction speed, and the like, the OLED display has been in the spotlight as a next-generation display device.

A unit pixel of the OLED display may include sub-pixels of a red pixel, a green pixel, and a blue pixel, and a desired color is displayed by color combination of the three sub-pixels. That is, each sub-pixel has an organic emission layer emitting one light of red, green, or blue between two electrodes, and the color of a unit pixel is displayed by an appropriate combination of light of the three colors.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention provide for an organic light emitting diode (OLED) display with improved color purity and viewing angle, and a simplified manufacturing method thereof.

In an exemplary embodiment of the present invention, an organic light emitting diode (OLED) display is provided. The OLED display includes: a first pixel including a first pixel electrode of a pixel electrode, a second pixel including a second pixel electrode of the pixel electrode, and a third pixel comprising a third pixel electrode of the pixel electrode; a resonance assistance layer on the first pixel electrode; an organic emission layer including a first organic emission layer on the resonance assistance layer and the second pixel electrode, a second organic emission layer on the first organic emission layer, and a third organic emission layer on the third pixel electrode; a common electrode on the organic emission layer; and a color mixture preventing layer on the common electrode. The color mixture preventing layer is configured to absorb overlapped light corresponding to an overlapped wavelength region of a wavelength region of first light emitted by the first organic emission layer and a wavelength region of second light emitted by the second organic emission layer.

The OLED display may further include a polarization film between the common electrode and the color mixture preventing layer.

The first pixel may include the color mixture preventing layer.

The color mixture preventing layer may include a support film and an absorption film on the support film. The absorption film may be configured to absorb the overlapped light.

The OLED display may further include a polarization film on the color mixture preventing layer.

The color mixture preventing layer may include a mixed layer of an adhesive of the polarization film and an absorber for absorbing the overlapped light.

The color mixture preventing layer may include a red filter.

The first pixel may include the red filter.

The overlapped wavelength region may include 560 nm to 590 nm.

The first organic emission layer and the second organic emission layer may have a same pattern.

The pixel electrode may include a reflection electrode and a transparent electrode on the reflection electrode. A distance between the reflection electrode and the common electrode may be different between the first pixel and the second pixel.

The distance between the reflection electrode and the common electrode may become shorter in an order of the first pixel, the second pixel, and the third pixel.

The first pixel may include a red pixel, the second pixel may include a green pixel, and the third pixel may include a blue pixel.

The transparent electrode may include crystalline transparent conductive oxide (TCO) and the resonance assistance layer may include amorphous TCO.

According to another exemplary embodiment of the present invention, a method for manufacturing an organic light emitting diode (OLED) display is provided. The method includes: forming a first pixel electrode for a first pixel, a second pixel electrode for a second pixel, and a third pixel electrode for a third pixel; forming a resonance assistance layer on the first pixel electrode; forming a first organic emission layer on the resonance assistance layer and the second pixel electrode; forming a second organic emission layer on the first organic emission layer; forming a third organic emission layer on the third pixel electrode; forming a common electrode on the second organic emission layer and the third organic emission layer; and forming a color mixture preventing layer on the common electrode.

The forming of the color mixture preventing layer may include forming the color mixture preventing layer in the first pixel.

The forming of the color mixture preventing layer may include forming the color mixture preventing layer for absorbing overlapped light corresponding to an overlapped wavelength region of a wavelength region of first light emitted by the first organic emission layer and a wavelength region of second light emitted by the second organic emission layer.

The method may further include forming a polarization film on the common electrode before the forming of the color mixture preventing layer.

The forming of the color mixture preventing layer may include forming a support film, and forming an absorption film for absorbing the overlapped light on the support film.

The method may further include forming a polarization film on the color mixture preventing layer.

The color mixture preventing layer may include a mixed layer of an adhesive of the polarization film and an absorber for absorbing the overlapped light.

The color mixture preventing layer may include a red filter.

The first pixel may include the red filter.

The overlapped wavelength region may include 560 nm to 590 nm.

The forming of the first organic emission layer may include using a first mask. The forming of the second organic emission layer may include using the first mask to produce a same pattern as the first organic emission layer.

The first pixel may include a red pixel, the second pixel may include a green pixel, and the third pixel may include a blue pixel.

Aspects of embodiments of the present invention can form organic emission layers for three colors by performing the mask process twice, thereby simplifying the process and improving productivity. In further aspects, the gaps between the deposited three colors' organic emission layers are reduced thereby realizing a high resolution of 300 pixels per inch (PPI). In other aspects, the color mixture preventing layer is formed to prevent or reduce the color interference between the red pixel and the green pixel formed with the same mask, thereby improving the viewing angle. In still further aspects, an absorber is mixed with an adhesive of a polarization film to simply form the color mixture preventing layer, thereby reducing color interference between the red pixel and the green pixel, and improving the viewing angle.

DETAILED DESCRIPTION

Figure 1:
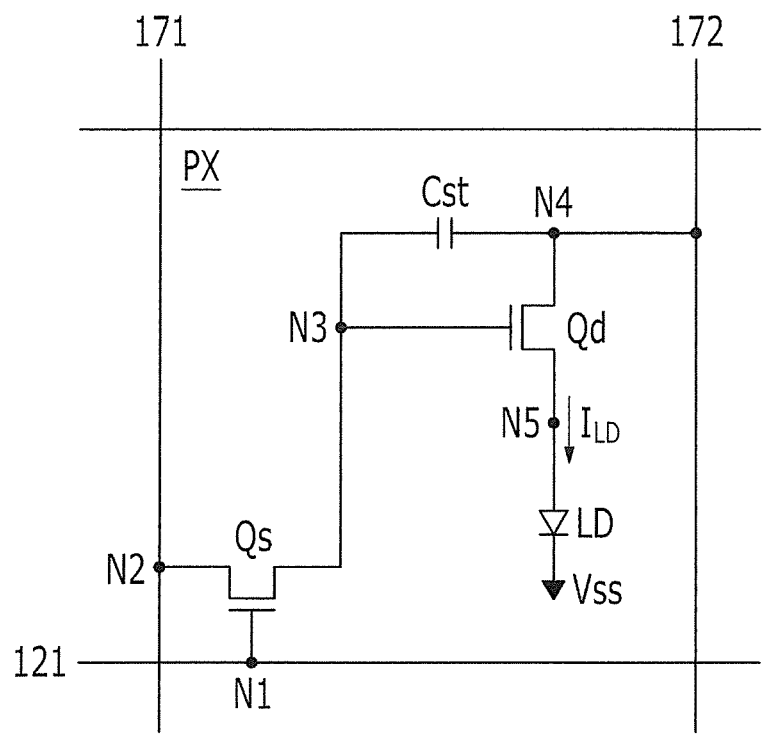
FIG. 1 shows an equivalent circuit of a sub-pixel in an organic light emitting diode (OLED) display according to a first exemplary embodiment.

The present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

Like reference numerals designate like elements throughout the specification. In addition, when a first element is described as "coupled to" a second element, the first element may be directly coupled (e.g., connected) to the second element or may be indirectly coupled (e.g., electrically connected) to the second element through one or more third elements.

Further, the size and thickness of each of elements that are displayed in the drawings may be arbitrarily shown for better understanding and ease of description. The present invention is not limited by the shown size and thickness.

The organic emission layer of an organic light emitting diode (OLED) display can be formed through a mask deposition method, wherein a fine metal mask (FMM) having the same pattern as the organic emission layer is disposed on a target material, and a source material is deposited through the mask to form an organic emission layer with a desired pattern on the target material. According to one way of performing the mask deposition method, the fine metal mask is exchanged with a new one each time one of the red, green, and blue sub-pixels is formed, so the mask process is performed three times. For example, a first fine metal mask is used when a red pixel is deposited, a second fine metal mask is used when a green pixel is deposited, and a third fine metal mask is used when a blue pixel is deposited, thereby completing an emission layer pattern of the unit pixel.

However, using three mask processes can decrease productivity. In addition, when the mask is disposed with a predetermined gap between the mask pattern and the neighboring color's organic emission layer, using three mask processes can worsen realization of high resolution.

An OLED display according to a first exemplary embodiment will now be described in detail with reference to FIG. 1 and FIG. 2.

FIG. 1 shows an equivalent circuit of a sub-pixel in the OLED display.

As shown in FIG. 1, the OLED display includes a plurality of signal lines 121, 171, and 172, and a sub-pixel PX coupled thereto. The sub-pixel PX can be one of a first pixel, a second pixel, or a third pixel, and the first pixel, the second pixel, and the third pixel can be a red pixel R, a green pixel G, and a blue pixel B, respectively (see FIG. 2).

The signal lines include a scanning signal line 121 for transmitting a gate signal (or a scan signal), a data line 171 for transmitting a data signal, and a driving voltage line 172 for transmitting a driving voltage. The scanning signal line 121 is provided in a row direction and is in parallel with other scanning signal lines. The data line 171 is provided in a column direction and is in parallel with other data lines. In FIG. 1, the driving voltage line 172 is shown in the column direction, but in other embodiments it can be configured differently, such as in the row direction or as a mesh.

Each sub-pixel PX includes a switching transistor Qs, a driving transistor Qd, a storage capacitor Cst, and an organic light emitting element LD.

The switching transistor Qs includes a control terminal coupled to a first node N1, an input terminal coupled to a second node N2, and an output terminal coupled to a third node N3. In further detail, the first node N1 is coupled to the scanning signal line 121, the second node N2 is coupled to the data line 171, and the third node N3 is coupled to the driving transistor Qd. The switching transistor Qs transmits the data signal provided through the data line 171 to the driving transistor Qd in response to the scan signal provided through the scanning signal line 121.

The driving transistor Qd includes a control terminal coupled to the third node N3, an input terminal coupled to a fourth node N4, and an output terminal coupled to a fifth node N5. In further detail, the third node N3 is between the output terminal of the switching transistor Qs and the control terminal of the driving transistor Qd, the fourth node N4 is between the driving voltage line 172 and the input terminal of the driving transistor Qd, and the output terminal N5 is between the organic light emitting element LD and the output terminal of the driving transistor Qd. The driving transistor Qd outputs an output current $I_{LD}$ that varies in accordance with a voltage between the third node N3 and the fifth node N5.

The capacitor Cst is coupled between the third node N3 and the fourth node N4. The capacitor Cst charges the data signal applied to the third node N3 and maintains the same after the switching transistor Qs is turned off.

For example, the organic light emitting element LD may be an OLED, including an anode coupled to the fifth node N5 and a cathode coupled to a common voltage Vss. The organic light emitting element LD displays the image by emitting light with different intensity depending on the output current $I_{LD}$ of the driving transistor Qd. The organic light emitting element LD can include an organic material that displays light of one or at least one of the primary colors including red, green, or blue, and the OLED display expresses the desired images by a spatial combination of the colors.

The switching transistor Qs and the driving transistor Qd are n-channel field effect transistors (FETs), but in other embodiments, at least one of them can be a p-channel FET. In addition, a connection state of the switching transistor Qs, the driving transistor Qd, the capacitor Cst, and the organic light emitting element LD may vary in other embodiments.

Figure 2:
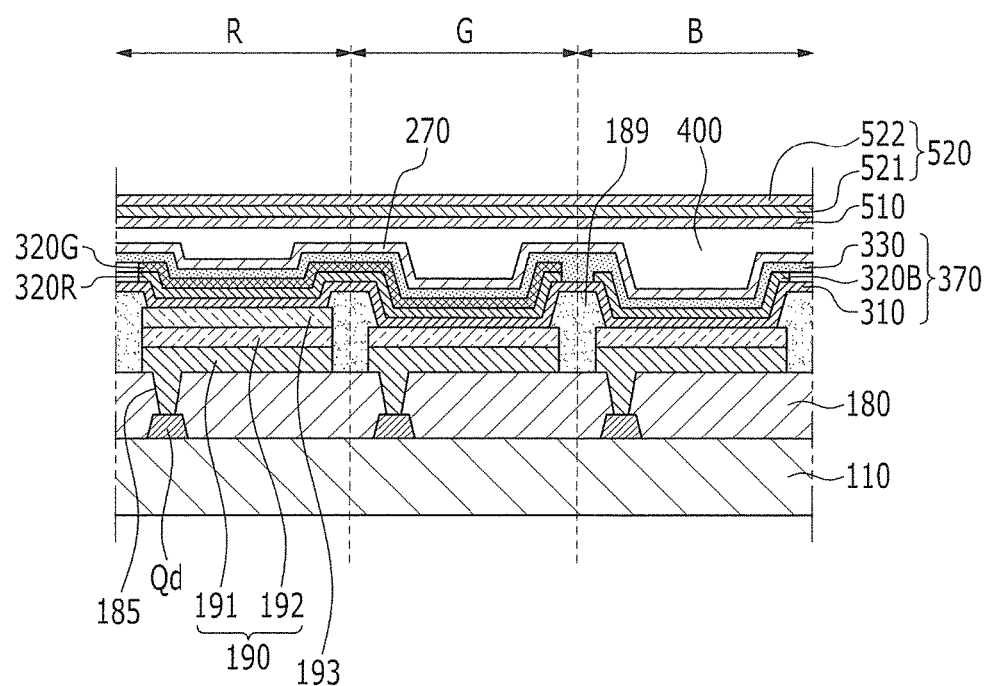
FIG. 2 shows a cross-sectional view of a unit pixel of the OLED display shown in FIG. 1.

FIG. 2 shows a cross-sectional view of a unit pixel of the OLED display shown in FIG. 1.

Referring to FIG. 2, a plurality of driving transistors Qd are formed on an insulation substrate 110 made of transparent glass or plastic. In addition, a plurality of signal lines (see FIG. 1) and a plurality of switching transistors (such as switching transistor Qs of FIG. 1) can be formed on the insulation substrate 110.

A protective layer 180 made of an inorganic or organic material can be formed on the driving transistor Qd. When the protective layer 180 is made of an organic material, its surface can be flat. A contact hole 185 for exposing a part of the driving transistor Qd is formed in the protective layer 180.

A pixel electrode 190 is formed on the protective layer 180 of the respective pixels (red pixel R, green pixel G, and blue pixel B). The pixel electrode 190 includes a first pixel electrode, a second pixel electrode, and a third pixel electrode formed in the red pixel R, green pixel G, and blue pixel B, respectively. The pixel electrode 190 includes a reflection electrode 191 and a transparent electrode 192 formed on the reflection electrode 191. The reflection electrode 191 is made of a metal with great reflectance such as silver (Ag) or aluminum (Al) or their alloys, and the transparent electrode 192 can include a crystalline transparent conductive oxide (TCO) layer made of a TCO such as indium tin oxide (ITO) or indium zinc oxide (IZO). For example, the transparent electrode 192 may include a crystalline ITO layer.

A resonance assistance layer 193 is formed on the pixel electrode 190 of the red pixel R, and includes an amorphous TCO layer made of a TCO such as ITO or IZO. For example, the resonance assistance layer 193 may include an amorphous ITO layer. The resonance assistance layer 193 is added to increase a gap between two electrodes (that is, the pixel electrode 190 and a common electrode 270) of the red pixel R and the two electrodes of the green pixel G. When the red organic emission layer 320R and the green organic emission layer 320G are commonly formed in the red pixel R and the green pixel G with the same shape, the red pixel R and the green pixel G emit red light and green light, respectively, because of the resonance assistance layer 193.

A pixel defining film 189 covering an edge of the pixel electrode 190 is formed on the protective layer 180. A hole auxiliary layer 310 is formed on the front surface of the pixel electrode 190 and the pixel defining film 189 in the red pixel R, green pixel G, and blue pixel B. The hole auxiliary layer 310 includes a hole injection layer (HIL) and a hole transport layer (HTL) stacked thereon.

The red organic emission layer 320R is commonly formed on the hole auxiliary layers 310 of the red pixel R and the green pixel G. In addition, the green organic emission layer 320G is formed on the red organic emission layer 320R. The red organic emission layer 320R and the green organic emission layer 320G are formed with the same pattern by using a first mask 10 (see FIG. 9), thereby simplifying the manufacturing process.

A blue organic emission layer 320B is independently formed on the hole auxiliary layer 310 of the blue pixel B. The red, green, and blue organic emission layers 320R, 320G, and 320B can be made of an organic material uniquely emitting red, green, and blue light, respectively.

An electron auxiliary layer 330 is formed on the green organic emission layer 320G formed in the red pixel R and the green pixel G, and on the blue organic emission layer 320B formed on the blue pixel B. The electron auxiliary layer 330 includes an electron transport layer (ETL) and an electron injection layer (EIL) stacked thereon.

The hole auxiliary layer 310 and the electron auxiliary layer 330 are provided to improve luminous efficiency of the red, green, and blue organic emission layers 320R, 320G, and 320B. In further detail, the HTL and the ETL balance the electrons and holes, respectively, while the HIL and the EIL reinforce injection of the electrons and holes, respectively.

The hole auxiliary layer 310, the red, green, and blue organic emission layers 320R, 320G, and 320B, and the electron auxiliary layer 330 form an organic light emitting member 370.

The common electrode 270 for transmitting the common voltage Vss is formed on the electron auxiliary layer 330. The common electrode 270 includes a lower layer and an upper layer, and can be a transflective electrode for reflecting some light and transmitting other light. The lower layer and the upper layer are made of a metal that reflects light, and they can reflect or transmit the incident light when they are made thin. Further, in other embodiments, the common electrode 270 can be a single layer.

In the OLED display, the pixel electrode 190, the organic light emitting member 370, and the common electrode 270 form an organic light emitting element LD. The pixel electrode 190 receives a voltage from the driving transistor Qd through the contact hole 185 of the protective layer 180.

The OLED display transmits light to the common electrode 270 to display the image. Light output to the common electrode 270 from the red, green, and blue organic emission layers 320R, 320G, and 320B is transmitted to the common electrode 270. Some of the light is passed through the common electrode 270 and some of the light is reflected and transmitted to the pixel electrode 190. The pixel electrode 190 reflects the light toward the common electrode 270. The light traveling between the pixel electrode 190 and the common electrode 270 generates interference. The light having a wavelength that corresponds to a distance between the pixel electrode 190 and the common electrode 270 generating resonance causes constructive interference to strengthen intensity, while the light having other wavelengths causes destructive interference to weaken the intensity.

The above-noted traveling and interference process of light is called a microcavity effect. In exemplary embodiments, the distance between the pixel electrode 190 and the common electrode 270 may become shorter in the order of the red pixel R, the green pixel G, and the blue pixel B.

The blue pixel B is formed when the blue organic emission layer 320B is a separate layer from the red pixel R and the green pixel G. Accordingly, a gap between the pixel electrode 190 and the common electrode 270 in the blue pixel B may be set to generate the constructive interference for blue light. The gap between the pixel electrode 190 and the common electrode 270 in the blue pixel B can be set by controlling a thickness of the blue organic emission layer 320B.

The red organic emission layer 320R and the green organic emission layer 320G are formed with the same pattern over the red pixel R and the green pixel G, respectively. The gap between the pixel electrode 190 and the common electrode 270 is different between the red pixel R and the green pixel G due to the resonance assistance layer 193 in the red pixel R. Accordingly, the gap between the pixel electrode 190 and the common electrode 270 is controlled by using the resonance assistance layer 193 so that red light constructive interference may occur in the red pixel R and green light constructive interference may occur in the green pixel G. Hence, the red pixel R outputs red light and the green pixel G outputs green light.

Hereinafter, an OLED display in which the red organic emission layer 320R and the green organic emission layer 320G are formed with the same pattern over the red pixel R and the green pixel G, and a resonance assistance layer 193 is formed in the red pixel R, will be defined to be a red and green overlapping OLED display.

An encapsulation layer 400 is formed on the common electrode 270. The encapsulation layer 400 can be formed with a thin film encapsulation layer generated by alternately stacking an organic film and an inorganic film. The encapsulation layer 400 encapsulates the organic light emitting member 370 and the common electrode 270 to prevent or reduce permeation of external moisture or oxygen.

A polarization film 510 is formed on the encapsulation layer 400. The polarization film 510 is formed in the light emitting direction of the OLED display to prevent or reduce the phenomenon that light provided into the OLED display and the reflected light that occurs by metal wires in the OLED display when the organic emission layer emits light are mixed with the light that is originally emitted to deteriorate the contrast ratio.

A color mixture preventing layer 520 for preventing or reducing color mixture of the red pixel R and the green pixel G is formed on the polarization film 510. The color mixture preventing layer 520 includes a transparent support film 521 and an absorption film 522 formed on the support film 521.

The absorption film 522 absorbs overlapped light that corresponds to an overlapped wavelength region P (see FIG. 4) of a wavelength region of the red light emitted by the red organic emission layer 320R and a wavelength region of the green light emitted by the green organic emission layer 320G. In further detail, the absorption film 522 absorbs the overlapped light of the overlapped wavelength region P of 560 nm to 590 nm and removes it.

Figure 3:
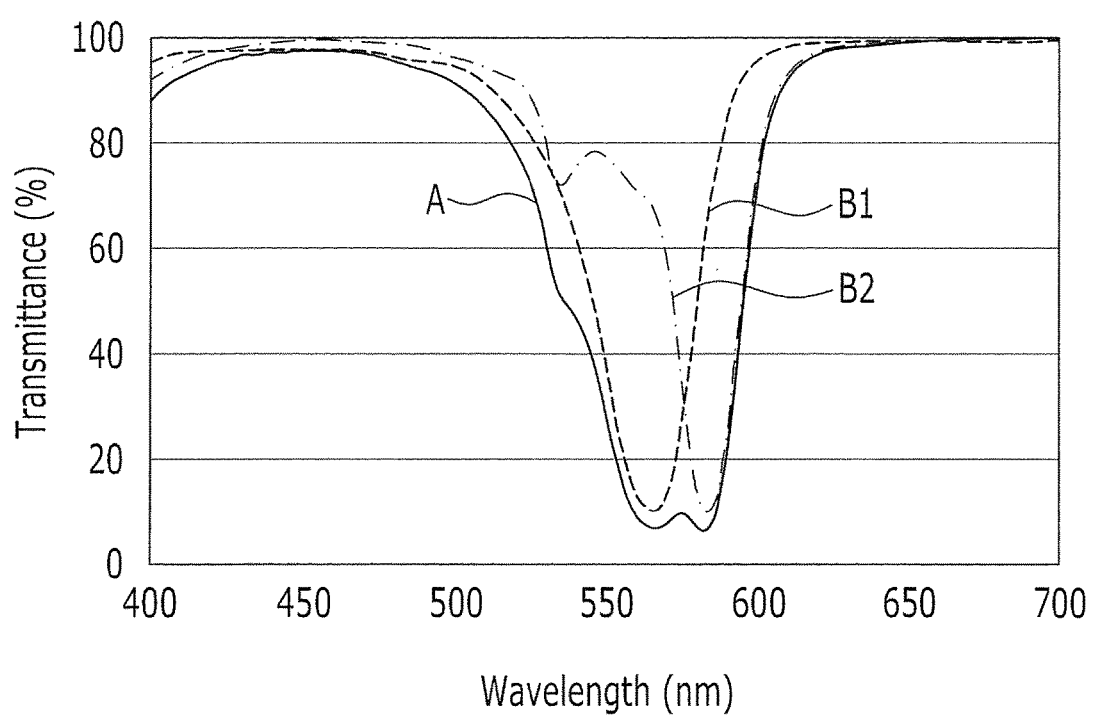
FIG. 3 shows a graph of transmittance of the OLED display of FIG. 2 according to a wavelength of a color mixture preventing layer.

FIG. 3 shows a graph of transmittance of the OLED display of FIG. 2 according to a wavelength of a color mixture preventing layer.

Referring to FIG. 3, a transmittance curve A shows corresponding transmittance (percentage) with respect to a wavelength of a red and green overlapping OLED display in which a color mixture preventing layer for removing overlapped light in an overlapped wavelength region of 560 nm to 590 nm is formed according to the embodiment of FIG. 2. In contrast, a transmittance curve B1 shows corresponding transmittance with respect to a wavelength of a Comparative Example 2 of a red and green overlapping OLED display in which a color mixture preventing layer for absorbing light in the overlapped wavelength region of 560 nm to 570 nm is formed, and a transmittance curve B2 shows corresponding transmittance of a wavelength of a Comparative Example 3 of a red and green overlapping OLED display in which a color mixture preventing layer for absorbing light of an overlapped wavelength region of 580 nm to 590 nm is formed.

As shown in curve A of FIG. 3, the color mixture preventing layer 520 reduces the transmittance of the overlapped light in the overlapped wavelength region of 560 nm to 590 nm to be nearly zero.

A red and green overlapping OLED display according to the exemplary embodiment of FIG. 2 will now be described in comparison with Comparative Examples 1 to 3 with reference to FIGS. 4-8.

Figure 4:
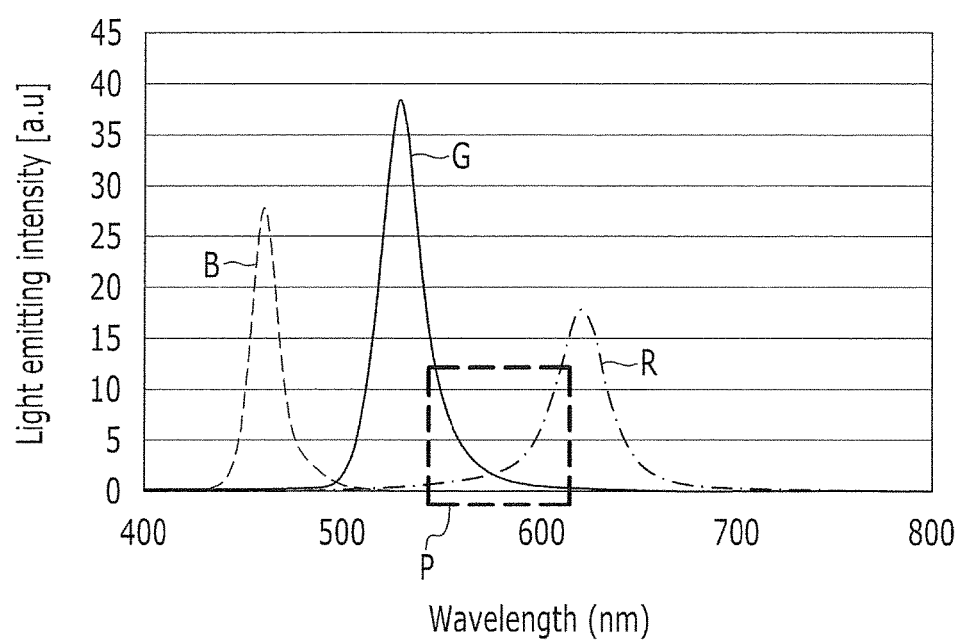
FIG. 4 shows a graph of light emitting intensity according to a wavelength in a Comparative Example 1 of a red and green overlapping OLED display in which no color mixture preventing layer is formed.
Figure 5:
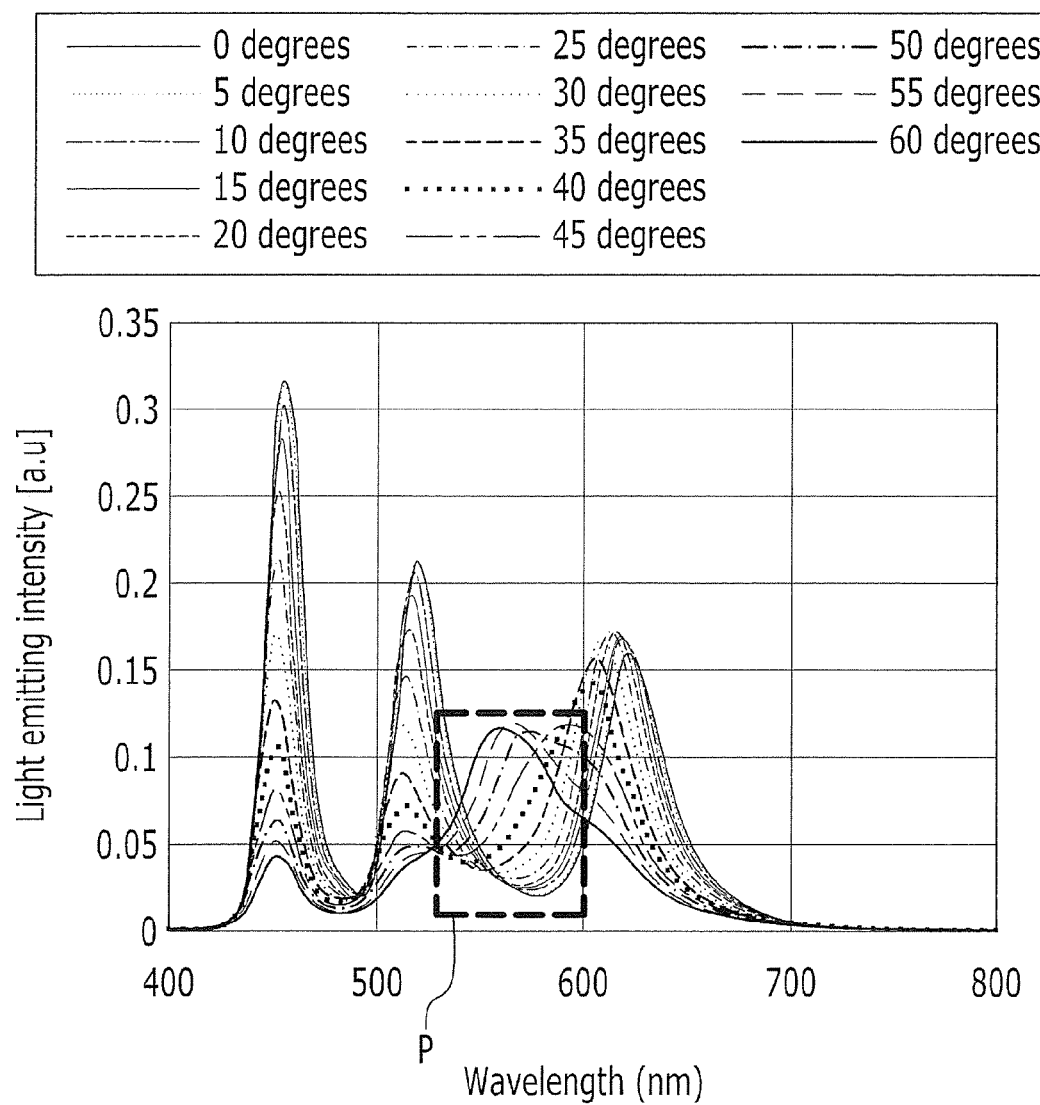
FIG. 5 shows a graph of light emitting intensity according to a viewing angle in the Comparative Example 1 of FIG. 4.
Figure 6:
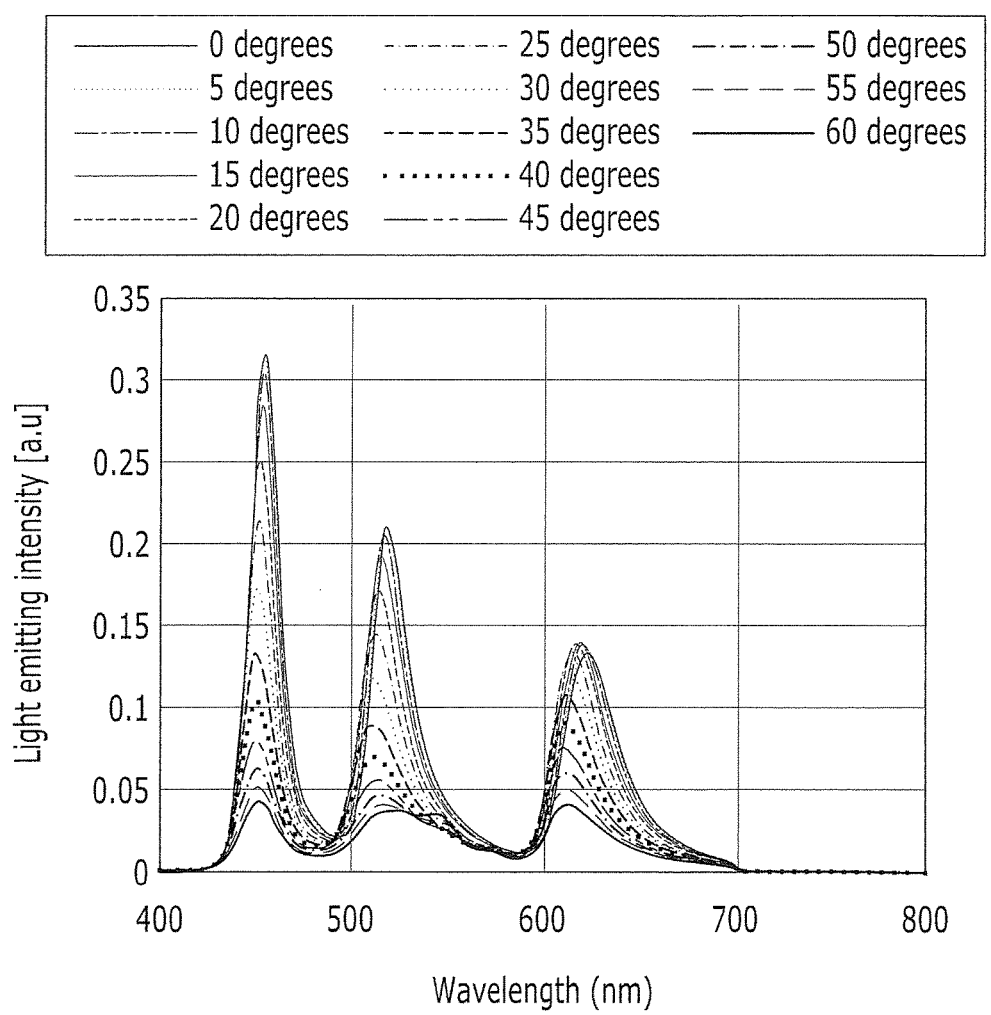
FIG. 6 shows a graph of light emitting intensity according to a viewing angle in a red and green overlapping OLED display of FIG. 2 in which a color mixture preventing layer is formed.

FIG. 4 shows a graph of light emitting intensity according to a wavelength in a Comparative Example 1 of a red and green overlapping OLED display in which no color mixture preventing layer is formed. FIG. 5 shows a graph of light emitting intensity according to a viewing angle in the Comparative Example 1 of FIG. 4. FIG. 6 shows a graph of light emitting intensity according to a viewing angle in the red and green overlapping OLED display of FIG. 2 in which a color mixture preventing layer is formed.

As shown in FIG. 4, in Comparative Example 1 of the red and green overlapping OLED display, the red organic emission layer 320R and the green organic emission layer 320G are stacked in both the red pixel R and the green pixel G, and a resonance assistance layer 193 is formed in the red pixel R to allow the red pixel R to emit red light and the green pixel G to emit green light. However, in this case, the red organic emission layer 320R and the green organic emission layer 320G are stacked in both the red pixel R and the green pixel G so the light is mutually interfered with in the overlapped wavelength region P of 560 nm to 590 nm. Accordingly, a small amount of green light is output from the red pixel R and a small amount of red light is output from the green pixel G, thereby deteriorating color purity of each pixel.

Further, as shown in FIG. 5, when the Comparative Example 1 of the red and green overlapping OLED display is viewed in the side direction, an optical transmission path of the light is changed to deteriorate the viewing angle. More particularly, the light emitting intensity of the red pixel R is severely changed depending on the viewing angle so that orange light may be output from the red pixel R.

However, as shown in FIG. 6, the color mixture preventing layer 520 of the red and green overlapping OLED display of FIG. 2 absorbs the overlapped light in the overlapped wavelength region of 560 nm to 590 nm, and transmits the light of other wavelength regions so that the overlapped wavelength region of 560 nm to 590 nm (that is, the light in the orange color region) is removed from the light passing through the color mixture preventing layer 520. Therefore, the color interference between the red pixel R and the green pixel G is reduced or prevented, thereby improving the viewing angle.

In addition, the color mixture preventing layer 520 is formed in the red pixel R, the green pixel G, and the blue pixel B, so there is no need to arrange it by colors. Further, the color mixture preventing layer 520 can be manufactured as a film to easily adhere to the OLED display.

In further embodiments, the wavelength region to be removed can be selected by stacking a plurality of color mixture preventing layers 520 so that any wavelength regions can be easily removed.

Figure 7:
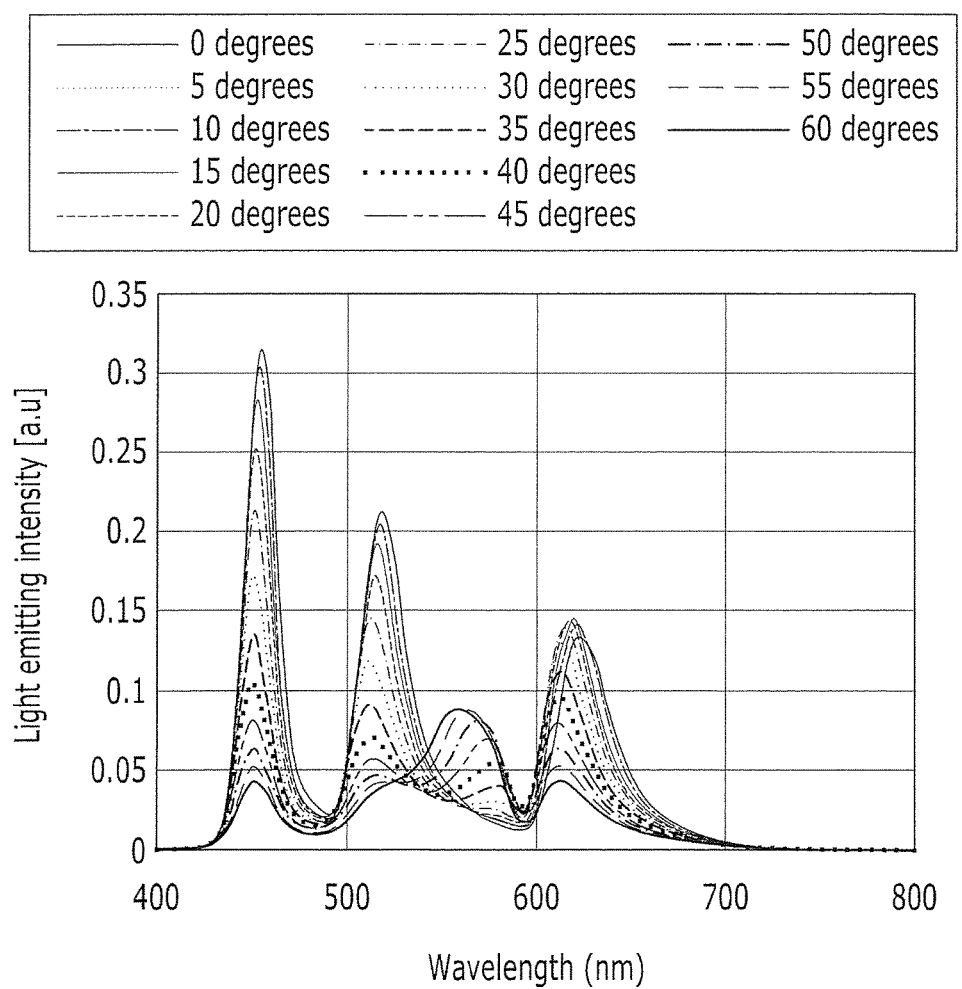
FIG. 7 shows a graph of light emitting intensity according to a viewing angle in a Comparative Example 2 of a red and green overlapping OLED display in which a color mixture preventing layer for absorbing light in an overlapped wavelength region of 560 nanometers (nm) to 570 nm is formed.
Figure 8:
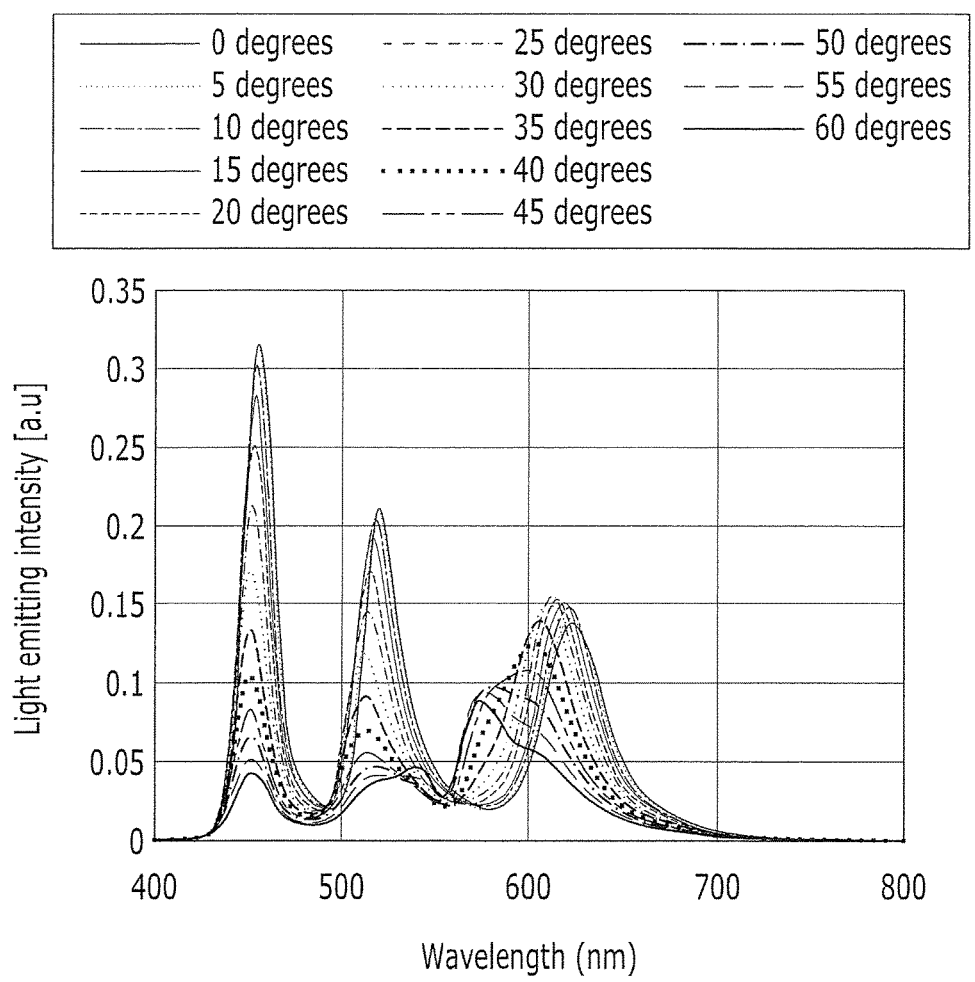
FIG. 8 shows a graph of light emitting intensity according to a viewing angle in a Comparative Example 3 of a red and green overlapping OLED display in which a color mixture preventing layer for absorbing light in an overlapped wavelength region of 580 nm to 590 nm is formed.

FIG. 7 shows a graph of light emitting intensity according to a viewing angle in the Comparative Example 2 of a red and green overlapping OLED display in which a color mixture preventing layer for absorbing light in an overlapped wavelength region of 560 nm to 570 nm is formed. FIG. 8 shows a graph of light emitting intensity according to a viewing angle in the Comparative Example 3 of a red and green overlapping OLED display in which a color mixture preventing layer for absorbing light in an overlapped wavelength region of 580 nm to 590 nm is formed.

As shown in FIG. 7 and FIG. 8, when the color mixture preventing layer 520 absorbs the light of the overlapped wavelength region of 560 nm to 570 nm or the light of the overlapped wavelength region of 580 nm to 590 nm, the color interference between the red pixel R and the green pixel G occurs to deteriorate the viewing angle. Therefore, the color mixture preventing layer 520 of the red and green overlapping OLED display according to the embodiment of FIG. 2 absorbs the light of the overlapped wavelength region of 560 nm to 590 nm and transmits the light of other wavelength regions to improve the viewing angle.

A method for manufacturing an OLED display according to the exemplary embodiment of FIG. 2 will now be described in detail with reference to FIG. 2, FIG. 9, and FIG. 10.

Figure 9:
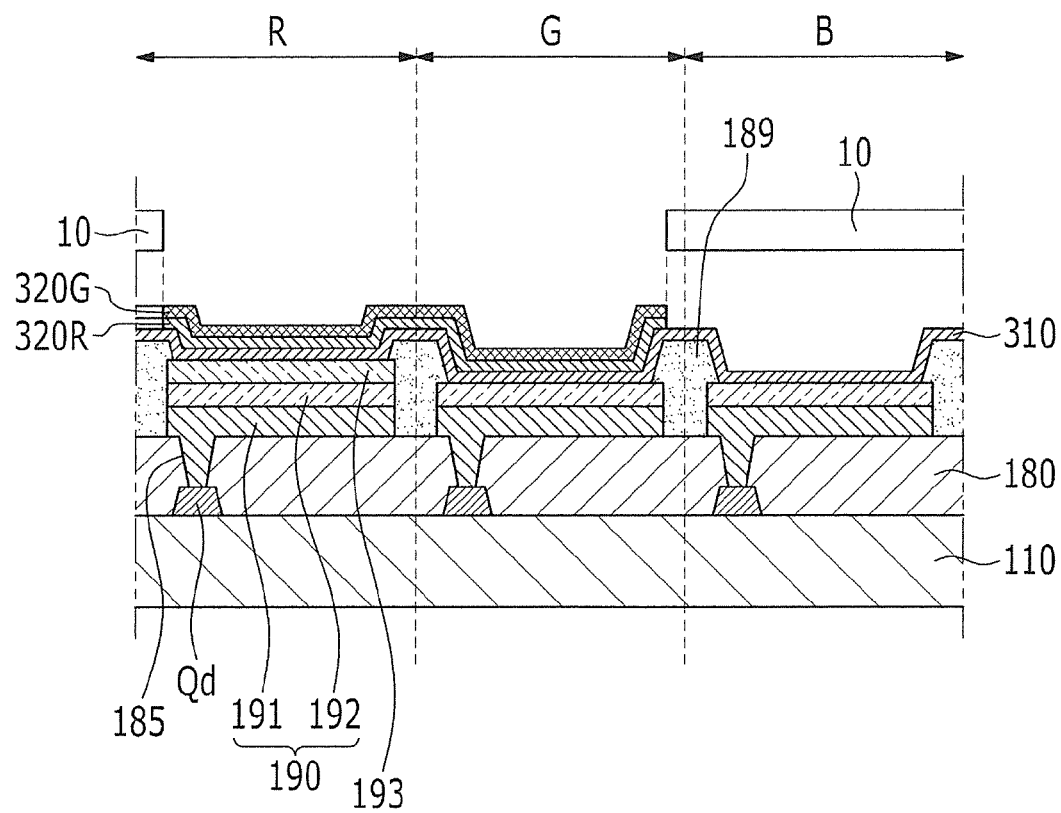
FIG. 9 shows a method for sequentially stacking a red organic emission layer and a green organic emission layer by using a first mask according to a method for manufacturing the OLED display of FIG. 2.

FIG. 9 shows a method for sequentially stacking a red organic emission layer 320R and a green organic emission layer 320G by using a first mask 10 according to a method for manufacturing the OLED display of FIG. 2. FIG. 10 shows a method for forming a blue organic emission layer 320B by using a second mask 20 according to the method of FIG. 9 for manufacturing the OLED display of FIG. 2.

Referring to FIG. 9, a plurality of driving transistors Qd are formed on an insulation substrate 110 and a protective layer 180 having a plurality of contact holes 185 is formed thereon. A reflection layer 191 and a crystalline conductive oxide member 192 are sequentially stacked on the protective layer 180 of the respective pixels R, G, and B, and are patterned to form a pixel electrode 190. In addition, a resonance assistance layer 193 with the same pattern as the pixel electrode 190 is formed on the pixel electrode 190 of the red pixel R. A pixel defining film 189 for covering edges of the pixel electrode 190 and the resonance assistance layer 193 is formed on the protective layer 180 by using a nitride or an oxide, and a hole auxiliary layer 310 is formed on the pixel electrode 190 and the pixel defining film 189 of the red, green, and blue pixels R, G, and B.

The first mask 10 having an opening corresponding to the red pixel R and the green pixel G is used to sequentially stack the red organic emission layer 320R and the green organic emission layer 320G on the hole auxiliary layer 310. The organic emission layer of the red pixel R and the organic emission layer of the green pixel G can be formed by using the single first mask 10 so the three-color organic emission layer is formed by performing the mask process twice, thereby simplifying the manufacturing process.

Further, the red pixel R and the green pixel G are formed by using the first mask 10, thereby reducing the gap between the red pixel R and the green pixel G and realizing high resolution.

Figure 10:
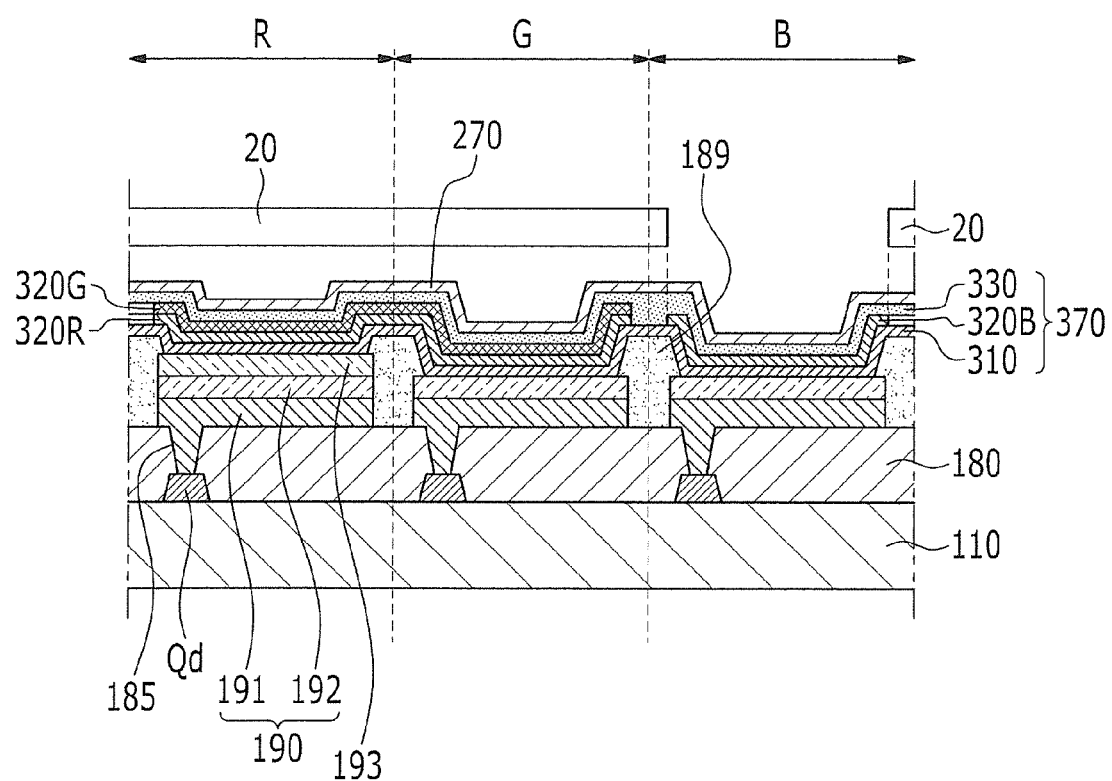
FIG. 10 shows a method for forming a blue organic emission layer by using a second mask according to the method of FIG. 9 for manufacturing the OLED display of FIG. 2.

As shown in FIG. 10, a blue organic emission layer 320B is formed on the hole auxiliary layer 310 by using the second mask 20 having an opening corresponding to the blue pixel B.

As shown in FIG. 2, an electron auxiliary layer 330 and a common electrode 270 are sequentially stacked on the green organic emission layer 320G and the blue organic emission layer 320B, and an organic film and an inorganic film are alternately formed thereon to form an encapsulation layer 400. A polarization film 510 is attached to the encapsulation layer 400, and a color mixture preventing layer 520 for absorbing the overlapped light in the overlapped wavelength region of 560 nm to 590 nm is attached to the polarization film 510. The color mixture preventing layer 520 is attached to the front surfaces of the red pixel R, the green pixel G, and the blue pixel B so it is not needed to be arranged by colors.

In other embodiments, the color mixture preventing layer 520 can be made as a film and attached to the OLED display. In addition, while the color mixture preventing layer 520 is formed over the polarization film 510 in the embodiment of FIG. 2, in other embodiments, the color mixture preventing layer can be formed below the polarization film.

Figure 11:
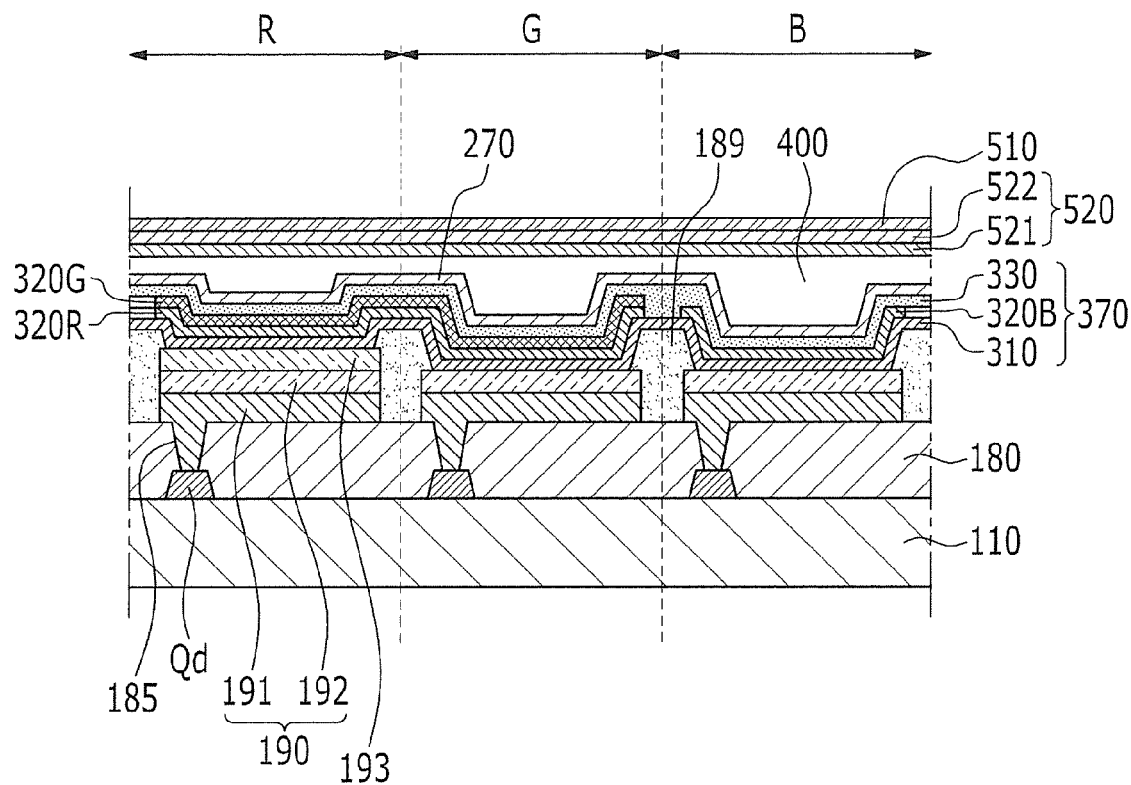
FIG. 11 shows a cross-sectional view of an OLED display according to a second exemplary embodiment.

FIG. 11 shows a cross-sectional view of an OLED display according to a second exemplary embodiment.

The exemplary embodiment shown in FIG. 11 is substantially equivalent to the exemplary embodiment shown in FIG. 2 except that the color mixture preventing layer is formed below the polarization film. Accordingly, repeated description of similar elements may not be provided.

As shown in FIG. 11, a color mixture preventing layer 520 for preventing or reducing color mixture of the red pixel R and the green pixel G is formed between the encapsulation layer 400 and the polarization film 510. The color mixture preventing layer 520 includes a support film 521 made of a transparent material and an absorption film 522 formed on the support film 521.

The absorption film 522 absorbs overlapped light that corresponds to an overlapped wavelength region P of a wavelength region of the red light emitted by the red organic emission layer 320R and a wavelength region of the green light emitted by the green organic emission layer 320G. In further detail, the absorption film 522 absorbs the overlapped light of the overlapped wavelength region P of 560 nm to 590 nm and removes it. Therefore, the overlapped wavelength region of 560 nm to 590 nm is removed from the light passing through the color mixture preventing layer 520 to prevent or reduce the color interference between the red pixel R and the green pixel G, and to improve the viewing angle.

The color mixture preventing layer 520 is formed in the red pixel R, the green pixel G, and the blue pixel B in the embodiment of FIG. 2. In other embodiments, the color mixture preventing layer can be formed only in the red pixel.

Figure 12:
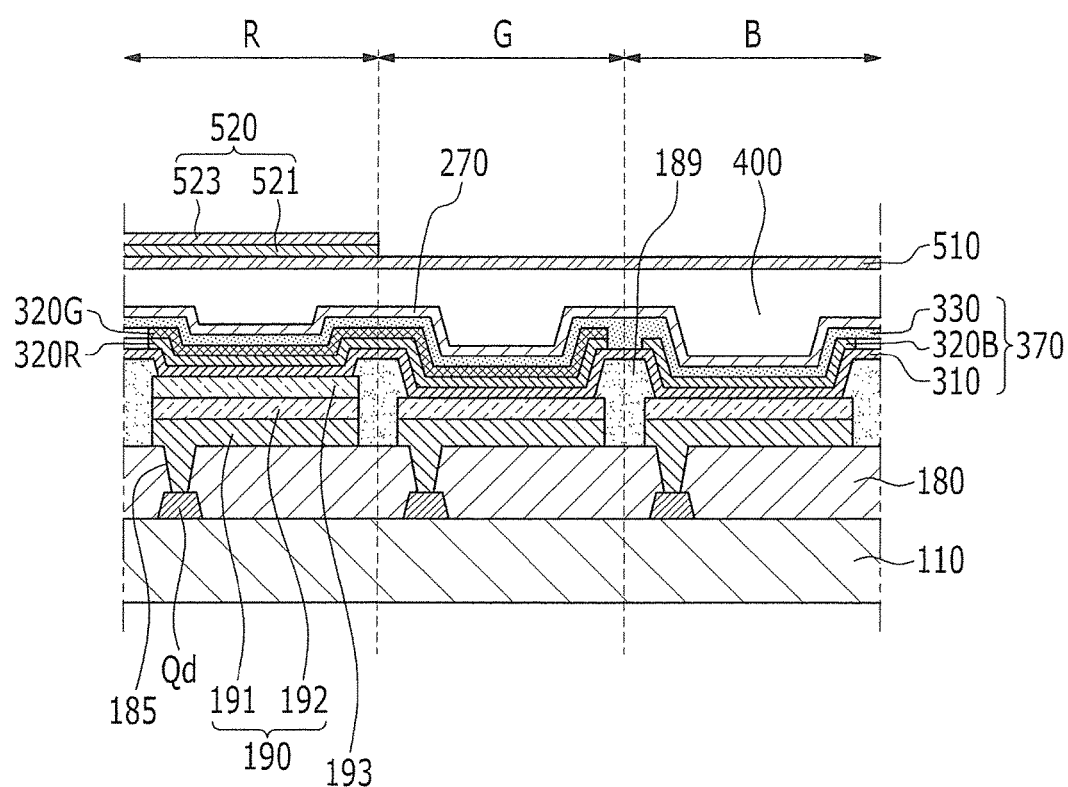
FIG. 12 shows a cross-sectional view of an OLED display according to a third exemplary embodiment.

FIG. 12 shows a cross-sectional view of an OLED display according to a third exemplary embodiment.

The exemplary embodiment shown in FIG. 12 is substantially equivalent to the exemplary embodiment shown in FIG. 2 except that the color mixture preventing layer is formed only in the red pixel. Accordingly, repeated description of similar elements may not be repeated.

As shown in FIG. 12, a color mixture preventing layer 520 for preventing or reducing color mixture of the red pixel R and the green pixel G is formed on the encapsulation layer 400 corresponding to the red pixel R. The color mixture preventing layer 520 includes a support film 521 made of a transparent material and an absorption film 523 formed on the support film 521.

The absorption film 523 absorbs overlapped light that corresponds to an overlapped wavelength region P of a wavelength region of the red light emitted by the red organic emission layer 320R and a wavelength region of the green light emitted by the green organic emission layer 320G. In further detail, the absorption film 523 absorbs the overlapped light of the overlapped wavelength region P of 560 nm to 590 nm and removes it. Therefore, the overlapped wavelength region of 560 nm to 590 nm is removed from the light passing through the color mixture preventing layer 520 to prevent or reduce the color interference between the red pixel R and the green pixel G, and to improve the viewing angle.

In the second OLED display of FIG. 11, the color mixture preventing layer 520 is configured with a support film 521 and an absorption film 522. In other embodiments, the color mixture preventing layer can be a mixed layer of an adhesive of the polarization film and an absorber for absorbing the overlapped light.

Figure 13:
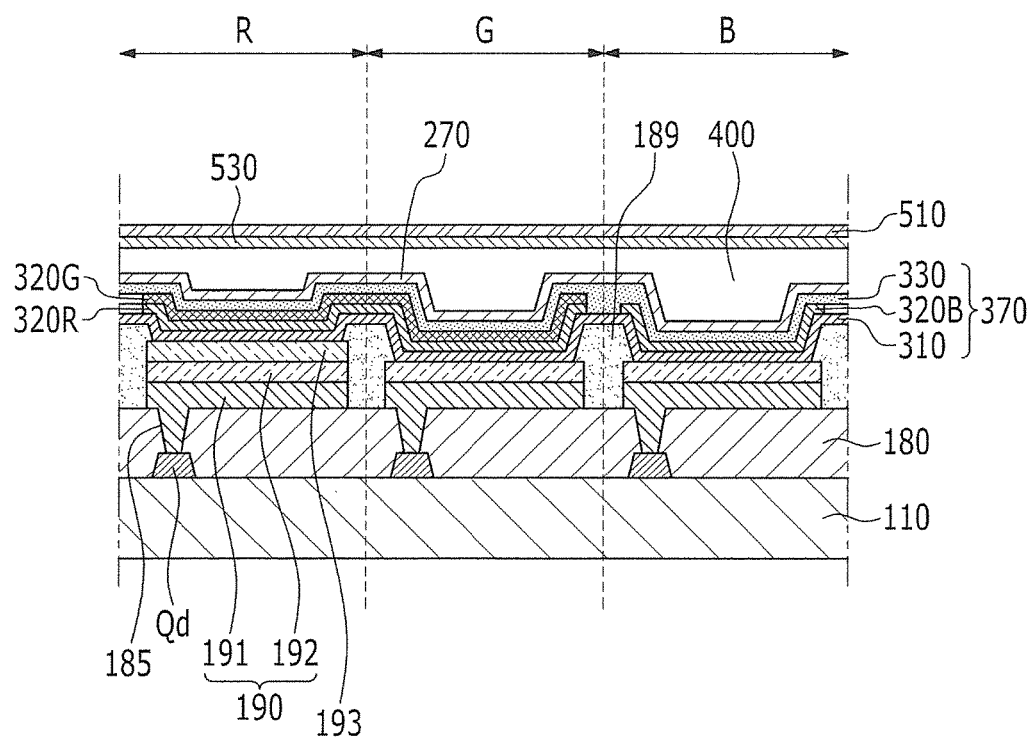
FIG. 13 shows a cross-sectional view of an OLED display according to a fourth exemplary embodiment.

FIG. 13 shows a cross-sectional view of an OLED display according to a fourth exemplary embodiment.

The exemplary embodiment shown in FIG. 13 is substantially equivalent to the exemplary embodiment shown in FIG. 11 except that the color mixture preventing layer is a mixed layer of an adhesive of the polarization film and an absorber for absorbing the overlapped light.

As shown in FIG. 13, a color mixture preventing layer 530 for preventing or reducing color mixture of the red pixel R and the green pixel G is formed between the encapsulation layer 400 and the polarization film 510. The color mixture preventing layer 530 can be a mixed layer of an adhesive for adhering the polarization film 510 to the encapsulation layer 400 and an absorber for absorbing the overlapped light. The absorber absorbs overlapped light that corresponds to an overlapped wavelength region P of a wavelength region of the red light emitted by the red organic emission layer 320R and a wavelength region of the green light emitted by the green organic emission layer 320G. In further detail, the absorber absorbs the overlapped light of the overlapped wavelength region P of 560 nm to 590 nm and removes it.

Therefore, the overlapped wavelength region of 560 nm to 590 nm is removed from the light passing through the color mixture preventing layer 530 to prevent or reduce the color interference between the red pixel R and the green pixel G, and to improve the viewing angle. Further, the color mixture preventing layer 530 can be easily formed by mixing the absorber and the adhesive of the polarization film.

In the exemplary OLED display of FIG. 11, the color mixture preventing layer 520 is configured with a support film 521 and an absorption film 522. In other embodiments, the color mixture preventing layer can include a red filter.

Figure 14:
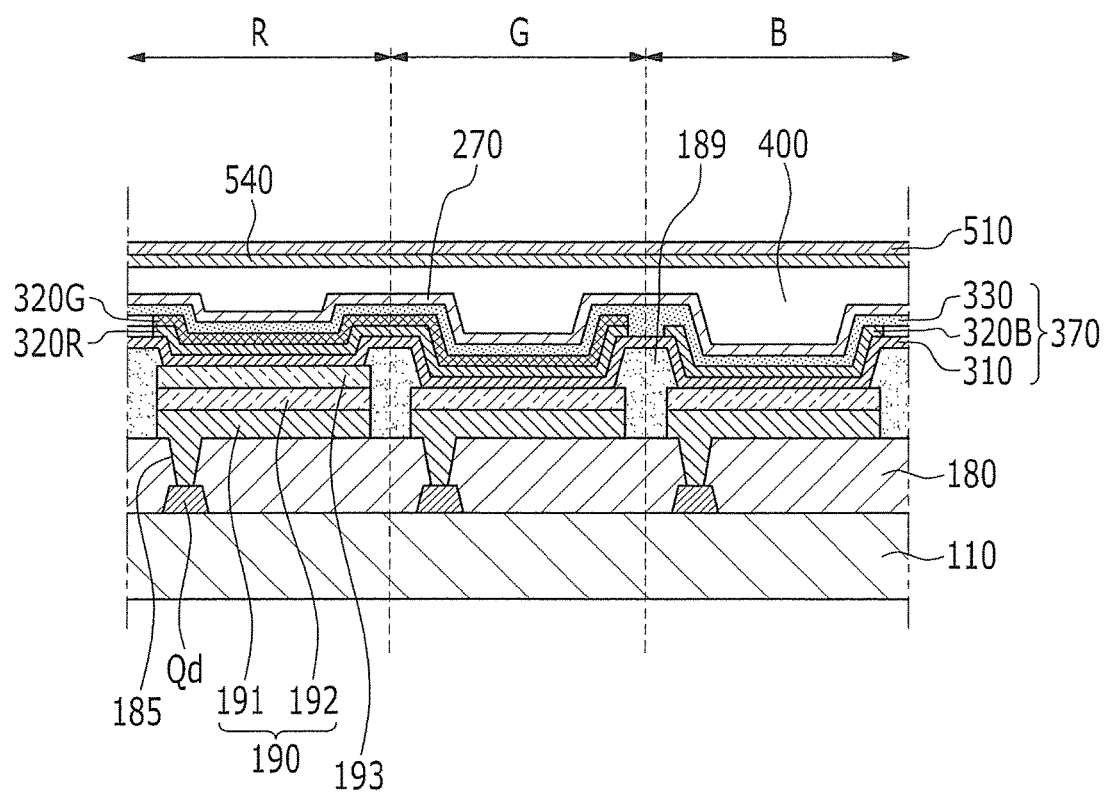
FIG. 14 shows a cross-sectional view of an OLED display according to a fifth exemplary embodiment.
Figure 15:
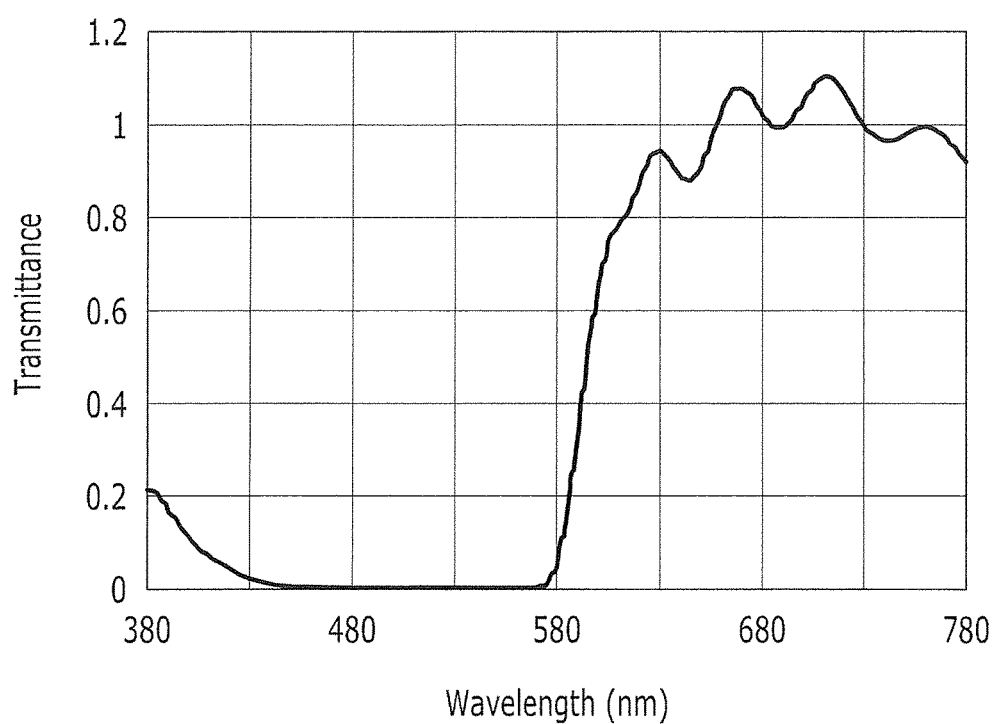
FIG. 15 shows a graph of transmittance of the OLED display of FIG. 14 according to a wavelength of a red filter.
Figure 16:
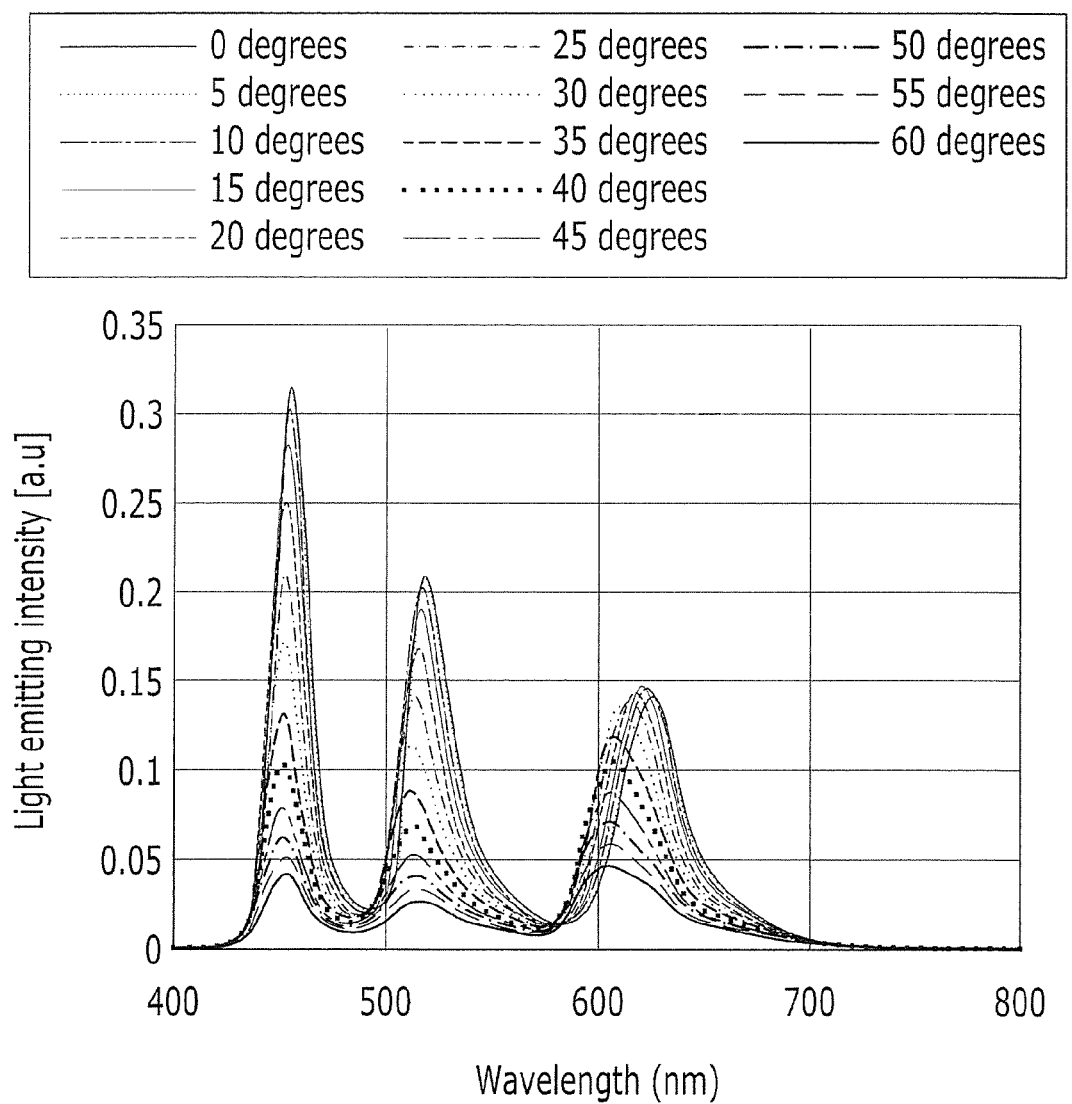
FIG. 16 shows a graph of light emitting intensity depending on viewing angle in the OLED display of FIG. 14.

FIG. 14 shows a cross-sectional view of an OLED display according to a fifth exemplary embodiment. FIG. 15 shows a graph of transmittance of the OLED display of FIG. 14 according to a wavelength of a red filter. FIG. 16 shows a graph of light emitting intensity depending on viewing angle in the OLED display of FIG. 14.

The exemplary embodiment shown in FIG. 14 is substantially equivalent to the exemplary embodiment shown in FIG. 11 except that the color mixture preventing layer includes a red filter. Accordingly, repeated description of similar elements may not be provided.

As shown in FIG. 14, a color mixture preventing layer 540 for preventing or reducing color mixture of the red pixel R and the green pixel G is formed between the encapsulation layer 400 and the polarization film 510. The color mixture preventing layer 540 includes a red filter formed in the red pixel R. A transparent filter can be formed in the green pixel G and the blue pixel B, respectively.

As shown in FIG. 15, the red filter transmits the light in the wavelength region of 580 nm to 780 nm and absorbs the light in the wavelength region that is less than 580 nm, so as shown in FIG. 16, the light in the overlapped wavelength region of 560 nm to 590 nm is removed from the light passing through the color mixture preventing layer 540 at the red pixel R thereby preventing or reducing color interference between the red pixel R and the green pixel G and improve the viewing angle.

While this disclosure has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims, and equivalents thereof.

What is claimed is:

1. An organic light emitting diode (OLED) display comprising:
   a substrate;
   a first pixel comprising a first pixel electrode of a pixel electrode, a second pixel comprising a second pixel electrode of the pixel electrode, and a third pixel comprising a third pixel electrode of the pixel electrode, the pixel electrode comprising a reflective electrode on the substrate and a transparent electrode on the reflective electrode;
a resonance assistance layer on the first pixel electrode;
an organic emission layer comprising:
   a first organic emission layer on the resonance assistance layer and the second pixel electrode;
   a second organic emission layer on the first organic emission layer; and
   a third organic emission layer on the third pixel electrode;
a transflective common electrode on the organic emission layer;
a color mixture preventing layer on the transflective common electrode, the color mixture preventing layer being configured to uniformly absorb overlapped light corresponding to an overlapped wavelength region of a wavelength region of first light emitted by the first organic emission layer and a wavelength region of second light emitted by the second organic emission layer while uniformly transmitting non-overlapped light corresponding to wavelength regions other than the overlapped wavelength region; and
a polarization film on the color mixture preventing layer,
wherein the color mixture preventing layer comprises only a single distinct layer formed by mixing an adhesive of the polarization film and an absorber for absorbing the overlapped light while transmitting the non-overlapped light.

2. The OLED display of claim 1, wherein the overlapped wavelength region comprises 560 nm to 590 nm.

3. The OLED display of claim 1, wherein the first organic emission layer and the second organic emission layer have a same pattern.

4. The OLED display of claim 1, wherein a distance between the reflective electrode and the transflective common electrode is different between the first pixel and the second pixel.

5. The OLED display of claim 4, wherein the distance between the reflective electrode and the transflective common electrode becomes shorter in an order of the first pixel, the second pixel, and the third pixel.

6. The OLED display of claim 5, wherein the first pixel comprises a red pixel, the second pixel comprises a green pixel, and the third pixel comprises a blue pixel.

7. The OLED display of claim 4, wherein the transparent electrode comprises crystalline transparent conductive oxide (TCO) and the resonance assistance layer comprises amorphous TCO.

8. The OLED display of claim 1, further comprising an encapsulation layer between the transflective common electrode and the color mixture preventing layer, the encapsulation layer comprising an organic film and an inorganic film that are alternately stacked, wherein the color mixture preventing layer directly contacts the encapsulation layer.

9. A method for manufacturing an organic light emitting diode (OLED) display, comprising:
   forming a first pixel electrode for a first pixel, a second pixel electrode for a second pixel, and a third pixel electrode for a third pixel by:
      forming a reflective electrode on a substrate;
      forming a transparent electrode on the reflective electrode to form a pixel electrode; and
      patterning the pixel electrode to form the first pixel electrode, the second pixel electrode, and the third pixel electrode;
   forming a resonance assistance layer on the first pixel electrode;
   forming a first organic emission layer on the resonance assistance layer and the second pixel electrode;
   forming a second organic emission layer on the first organic emission layer;
   forming a third organic emission layer on the third pixel electrode;
   forming a transflective common electrode on the second organic emission layer and the third organic emission layer;
   forming a color mixture preventing layer on the transflective common electrode, the color mixture preventing layer for uniformly absorbing overlapped light corresponding to an overlapped wavelength region of a wavelength region of first light emitted by the first organic emission layer and a wavelength region of second light emitted by the second organic emission layer while uniformly transmitting non-overlapped light corresponding to wavelength regions other than the overlapped wavelength region, the forming of the color mixture preventing layer comprising:
      mixing an adhesive of a polarization film and an absorber for absorbing the overlapped light while transmitting the non-overlapped light; and
      forming the color mixture preventing layer as only a single distinct layer of the mixed adhesive and absorber on the transflective common electrode; and
      forming the polarization film on the color mixture preventing layer.

10. The method of claim 9, wherein the overlapped wavelength region comprises 560 nm to 590 nm.

11. The method of claim 9, wherein
the forming of the first organic emission layer comprises using a first mask, and
the forming of the second organic emission layer comprises using the first mask to produce a same pattern as the first organic emission layer.

12. The method of claim 9, wherein the first pixel comprises a red pixel, the second pixel comprises a green pixel, and the third pixel comprises a blue pixel.

* * * * *